United States Patent [19]

Hirokane et al.

[11] Patent Number: 5,457,006
[45] Date of Patent: Oct. 10, 1995

[54] METHOD OF MANUFACTURING PHOTO-MASK AND PHOTO-MASK MANUFACTURED THEREBY

[75] Inventors: Junji Hirokane, Tenri; Hiroyuki Katayama, Ikoma; Akira Takahashi; Tetsuya Inui, both of Nara; Kenji Ohta, Kitakatsuragi; Junichi Washo, Ikoma; Tomoyuki Miyake, Tenri; Kazuo Van, Nara; Michinobu Mieda, Tenri, all of Japan

[73] Assignee: Sharp Kabushiki Kaisha, Osaka, Japan

[21] Appl. No.: 684,680

[22] Filed: Mar. 29, 1991

Related U.S. Application Data

[62] Division of Ser. No. 19,704, Feb. 27, 1987, Pat. No. 5,087,535.

[30] Foreign Application Priority Data

| Feb. 28, 1986 | [JP] | Japan | 61-45754 |
| Apr. 1, 1986 | [JP] | Japan | 61-76337 |
| Apr. 1, 1986 | [JP] | Japan | 61-76338 |
| May 21, 1986 | [JP] | Japan | 61-117932 |
| Jul. 29, 1986 | [JP] | Japan | 61-178195 |

[51] Int. Cl.⁶ ............................... G03C 5/00
[52] U.S. Cl. ............ 430/323; 430/5; 430/321; 430/324; 430/329; 430/945; 369/277; 369/284; 369/285; 378/35
[58] Field of Search ............ 430/5, 321, 323, 430/324, 329, 945; 369/277, 284, 285; 378/35

[56] References Cited

U.S. PATENT DOCUMENTS

| 4,094,347 | 9/1977 | Smith, Jr. | 141/313 |
| 4,401,738 | 8/1983 | Iwamatsu | 430/5 |
| 4,423,137 | 12/1983 | Rester | 430/5 |
| 4,655,876 | 4/1987 | Kawai et al. | 430/321 |
| 4,686,162 | 8/1987 | Shangl et al. | 430/5 |
| 4,797,316 | 1/1989 | Hecq et al. | 430/323 |
| 4,925,776 | 5/1990 | Ohta et al. | 430/5 |
| 4,980,262 | 12/1990 | Thomas et al. | 369/277 |
| 5,079,113 | 1/1992 | Ohta et al. | 430/5 |

FOREIGN PATENT DOCUMENTS

| 0069265 | 6/1982 | European Pat. Off. . | |
| 1060717 | 4/1956 | Germany | |
| 208988 | 8/1981 | Germany | |
| 23631 | 8/1978 | Japan . | |
| 53-143204 | 12/1978 | Japan | 430/5 |
| 56-5545 | 1/1981 | Japan . | |
| 57-112727 | 9/1981 | Japan . | |
| 57-207256 | 12/1982 | Japan | 430/5 |
| 0098923 | 6/1983 | Japan | 430/5 |
| 58-202526 | 11/1983 | Japan . | |
| 59-9659 | 1/1984 | Japan . | |
| 59-68744 | 4/1984 | Japan . | |
| 172648 | 9/1984 | Japan . | |
| 0041228 | 3/1985 | Japan | 430/5 |
| 61-56349 | 3/1986 | Japan . | |

OTHER PUBLICATIONS

Thompson, Willson and Bowden; "Introduction to Microlithography"; pp. 216–218, ACS Symposium Series, 1983.

Suzuki and Matsui, "High Flatness Mask for Step and Repeat X–Ray Lithography", J. Vac. Sci. Technol. B4(1), Jan./Feb. 1986 pp. 221–225.

Thompson et al., "Introduction to Microlithography", Section 2.3 X–ray Lithography pp. 74–81, ACS 1983.

*Primary Examiner*—Thomas R. Neville
*Attorney, Agent, or Firm*—Birch, Stewart, Kolasch & Birch

[57] ABSTRACT

A photo-mask and a method of manufacturing a photo-mask, which includes the steps of applying a resist film onto a substrate of quartz, glass and the like, subjecting the resist film to light exposure and development to form a fine resist pattern, etching the mask substrate covered by the fine resist pattern, causing a non-light transmitting thin film of Cr, Ta, etc. to adhere thereon by vapor deposition, sputtering and the like, and removing the thin film on the resist pattern together with the resist film, thereby to form the photo-mask.

3 Claims, 11 Drawing Sheets

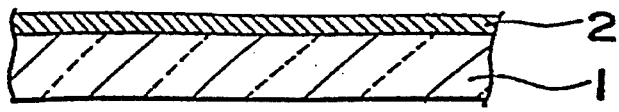
Fig. 14 (a) PRIOR ART
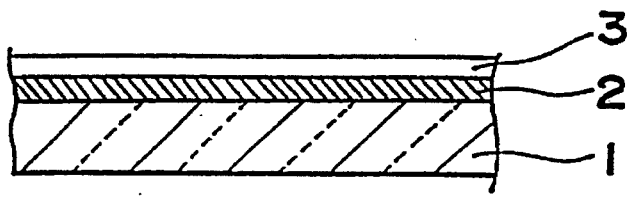
Fig. 14 (b) PRIOR ART
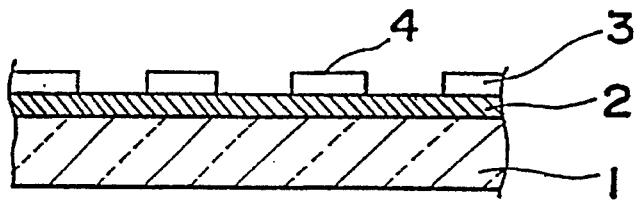
Fig. 14 (c) PRIOR ART
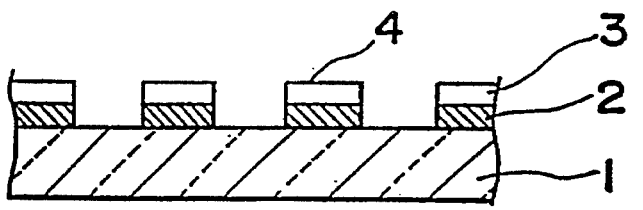
Fig. 14 (d) PRIOR ART
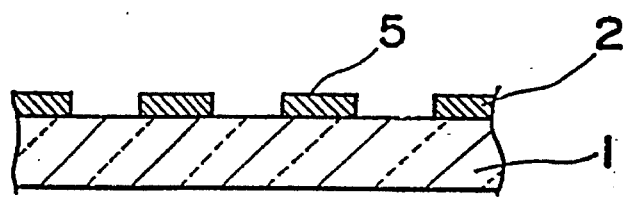
Fig. 14 (e) PRIOR ART
Fig. 15 PRIOR ART
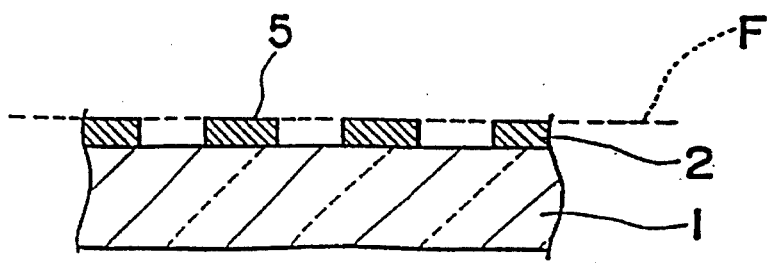

METHOD OF MANUFACTURING PHOTO-MASK AND PHOTO-MASK MANUFACTURED THEREBY

This application is a divisional application of U.S. Ser. No. 07/019,704 filed Feb. 27, 1987, now U.S. Pat. No. 5087535, which is incorporated herein by reference.

BACKGROUND OF THE INVENTION

The present invention generally relates to a photo-mask and more particularly, to a method of manufacturing a photo-mask to be employed for a pattern exposure process (lithography) in a production line of an optical disc, and a photo-mask produced by said manufacturing method.

Commonly, a photo-mask has been employed for the formation of a pattern on an optical disc by a light exposure system. The conventional manufacturing process for such a photo-mask generally includes manufacturing steps as shown, for example, in FIGS. 14(a) to 14(e).

More specifically, at a step in FIG. 14 (a), a non-light transmitting film 2 of Cr or the like is formed on a mask substrate 1 by vapor deposition, sputtering, etc., and then, at a step in FIG. 14 (b), a resist film 3 is applied onto said thin film 2. Thereafter, by subjecting said resist film 3 to exposure and development, a resist pattern 4 is formed (FIG. 14 (c)). Subsequently, the thin film 2 is subjected to etching (FIG. 14(d)), and finally, the resist film 3 is removed, thereby to form the photo-mask having a mask pattern 5 (FIG. 14 (e)).

The photo-mask manufactured by the conventional method as described above, however, has such a disadvantage that various faults tend to be formed therein, since separation of the mask pattern takes place in a cleaning process and the like. Furthermore, owing to the recent tendency toward recording at a higher density, the mask-pattern has been required to be finer, and thus, it has become necessary to solve the defect in the conventional method as referred to above.

SUMMARY OF THE INVENTION

Accordingly, an essential object of the present invention is to provide a method of manufacturing a highly reliable photo-mask with a long life and not readily susceptible to such a defect as separation of a mask-pattern, etc., with substantial elimination of disadvantages inherent in the conventional manufacturing methods of this kind.

Another important object of the present invention is to provide a superior photo-mask produced by the manufacturing method as referred to above.

In accomplishing these and other objects, according to one aspect of the present invention, there is provided a novel method of manufacturing a photo-mask, which includes the steps of applying a resist film onto a substrate of quartz, glass and the like, subjecting the resist film to light exposure and development to form a fine resist pattern, etching the mask substrate covered by said fine resist pattern so as to cause a non-light transmitting thin film of Cr, Ta, etc. to adhere thereon by vapor deposition, sputtering and the like, and removing said thin film on the resist pattern together with said resist film, thereby to form said photo-mask.

In another aspect, the present invention provides a method of manufacturing a photo-mask, which includes the steps of causing a light-transmitting thin film of $Si_3N_4$, etc. to adhere onto a mask substrate of quartz, glass, etc. by vapor deposition, sputtering, etc., applying a resist film thereonto, subjecting the resist film to light exposure and development to form a fine resist pattern, further subjecting said thin film to isotropic etching in a state as covered by said resist pattern so as to form a groove means in a portion not covered by said resist pattern, further applying thereon a light-shielding thin film of Cr, Ta and the like by vapor deposition, sputtering, etc. and removing said light-shielding thin film adhering to the portion of the resist pattern together with said resist film.

In a further aspect of the present invention, there is provided a method of manufacturing a photo-mask, which includes the steps of applying a resist film onto a mask substrate of quartz, glass or the like, subjecting the resist film to light exposure and development to form a fine resist pattern, isotropically etching the mask substrate covered by said fine resist pattern after anisotropic etching thereof so as to form a groove means in a portion not covered by said resist pattern and to cause a light-shielding thin film of Cr, Ta, etc. to adhere thereonto by vapor deposition, sputtering and the like, and removing said light-shielding thin film on the resist pattern together with said resist film, thereby to form said photo-mask.

In still another aspect, the present invention provides a method of manufacturing a photo-mask, which comprises the steps of applying onto a mask substrate, a first thin film having a nature in which isotropic etching proceeds in a dry etching process, further applying a resist film thereonto, further subjecting said resist film to light exposure and development to form a fine resist pattern, further subjecting the mask substrate covered by said resist pattern to dry etching so as to form grooves in portions not covered by said resist pattern, further applying a second thin film of non-light transmitting nature thereonto, subsequently removing said second thin film adhering to the resist pattern together with said resist film, and finally removing said thin film or removing said first thin film integrally with said resist film.

In the photo-mask according to the present invention as described above, grooves are formed in the mask substrate so as to form the mask-pattern therein. Such grooves for the mask pattern are formed by the dry etching process. The resist pattern for the mask pattern is formed on the first thin film having the nature in which the isotropic etching proceeds in the dry etching process. Accordingly, the first thin film is formed with side etching in the dry etching process, and therefore, the resist film, etc. may be readily removed to provide a highly accurate mask pattern.

In a still further aspect of the present invention, there is also provided a method of manufacturing a photo-mask, which includes the steps of forming a resist layer on a light-transmitting mask substrate, forming desired pattern on said resist layer by light exposure and development, forming grooves of a desired pattern on the light-transmitting mask substrate by anisotropic etching, removing the resist layer on said light-transmitting mask substrate, forming a light-shielding material layer on said light-transmitting mask substrate formed with said grooves, further forming a height-supplementing layer on said light-shielding material layer so as to make the surface to be generally of a uniform height, and removing said height-supplementing layer and said light-shielding layer by a predetermined thickness so as to cause the surface of said mask substrate other than the portions of said grooves to be exposed.

Since the manufacturing method of the photo-mask according to the present invention may be effected through utilization of the conventional photo-mask manufacturing technique, there is such an advantage that it can be readily put into actual application, with less requirements for new installation and facilities.

In another aspect of the present invention, there is provided the novel photo-mask which includes a substrate of quartz, glass, etc., and an opaque metal layer such as Ta, Cr and the like filled in a groove means formed by removing part of said substrate, with the surface of said metal layer being formed to be generally flush with the surface of said substrate.

BRIEF DESCRIPTION OF THE DRAWINGS

These and other objects and features of the present invention will become apparent from the following description taken in conjunction with the preferred embodiments thereof with reference to the accompanying drawings, in which:

FIGS. 14(a) to 14(e) are schematic sectional diagrams showing manufacturing steps of a conventional photo-mask (already referred to); and FIG. 15 is a fragmentary side sectional view of the conventional photo-mask.

DETAILED DESCRIPTION OF THE INVENTION

Figure 1A:
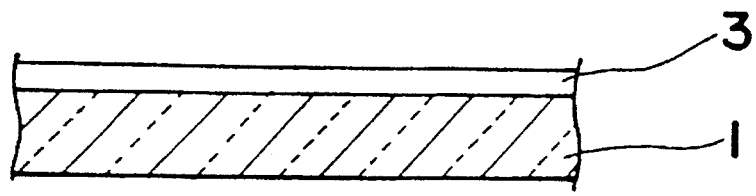
FIGS. 1(a) to 1(e) are schematic sectional diagrams showing manufacturing steps of a photo-mask according to a first embodiment of the present invention.

Before the description of the present invention proceeds, it is to be noted that like parts are designated by like reference numerals throughout the accompanying drawings.

Referring now to the drawings, there is shown in FIGS. 1(a) through 1(e) a method of manufacturing a photomask according to a first embodiment of the present invention, in the order of manufacturing steps as described hereinbelow.

Step (i) A resist film 3 is applied onto a mask substrate 1 made of quartz, glass or the like (FIG. 1(a)).

Figure 1B:
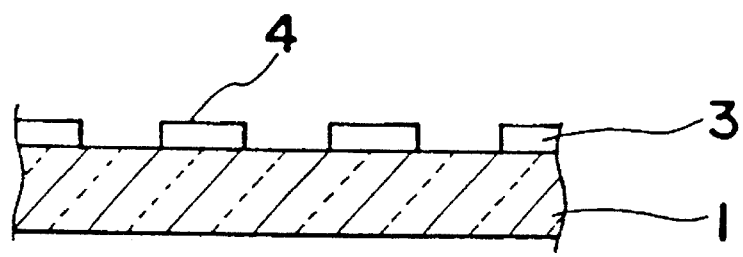

Step (ii) The resist film 3 is subjected to light exposure through employment of an electron beam or laser light so as to form a resist pattern 4 through a developing process (FIG. 1(b)).

Figure 1C:
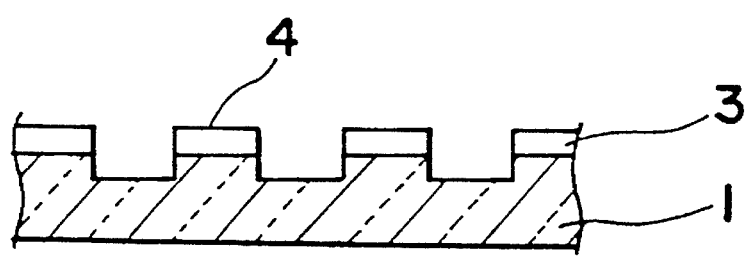

Step (iii) In the state as covered by the resist pattern 4, the mask substrate 1 is subjected to etching by wet etching or dry etching at portions not covered by the resist film (FIG. 1(c)).

Figure 1D:
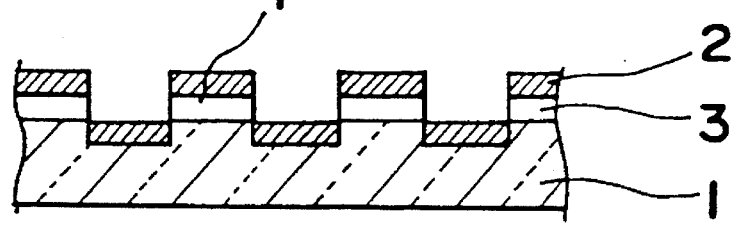

Step (iv) After completion of the above etching, and in the state as covered by the resist pattern 4, a thin film 2 of Cr, Ta or the like not transmitting light such as ultraviolet rays, etc. therethrough is caused to adhere thereonto by vapor deposition, sputtering or the like (FIG. 1(d)).

Figure 1E:
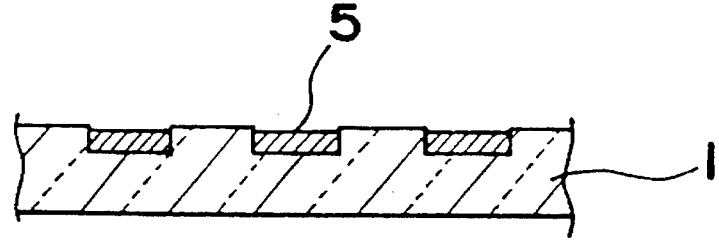

Step (v) Finally, the thin film 2 adhering onto the resist pattern 4 is separated together with the resist pattern 4, thereby to form the photo-mask having a mask pattern 5 (FIG. 1(e)).

Figure 2:
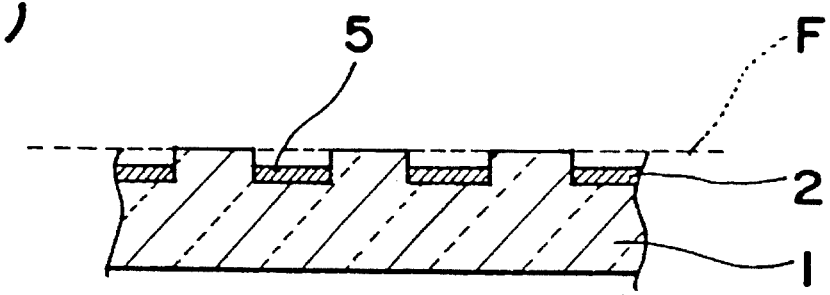
FIGS. 2(a) to 2(c) are fragmentary side sectional views of photo-masks prepared by the method of the present invention.
Figure 2:
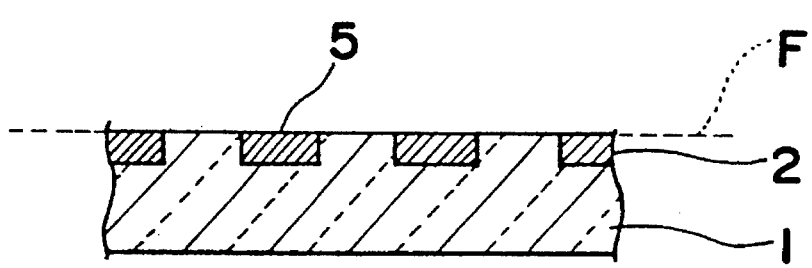
Figure 2:
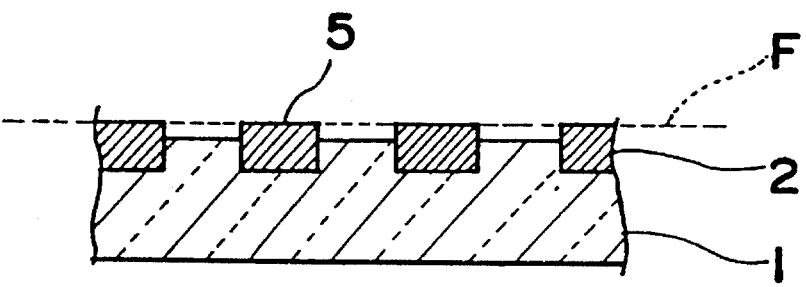

For comparison, FIGS. 2(a), 2(b) and 2(c) show fragmentary cross sections of the photo-masks produced by the method of the present invention, while FIG. 15 represents the fragmentary cross section of a photo-mask produced by a conventional manufacturing method given in FIG. 14.

In the conventional photo-mask in FIG. 15, the contact face F of the photo-mask with respect to an external object (not shown) is on the upper surface of the mask pattern 5, which is directly affected by an external force due to washing, etc., and therefore, such mask pattern 5 may be undesirably separated partly.

On the other hand, with respect to the photo-masks prepared by the method of the present invention, in the case of the photo-mask shown in FIG. 2(a), the contact face F with the external object is located on the surface of the mask substrate 1, and accordingly, the external force due to washing, etc. is absorbed into the surface of said substrate, and since the surface of the mask pattern 5 is slightly lower than the surface of the mask substrate 1, said mask pattern 5 is not readily separated. In the case of FIG. 2(b), the surface of the mask pattern 5 is adapted to coincide with the surface of the mask substrate 1, and thus, the external force uniformly affects both surfaces of the substrate 1 and the mask pattern 5, and therefore, separation of the mask pattern 5 does not easily occur similarly as in the case of FIG. 2(a). Meanwhile, in the arrangement of FIG. 2(c), the contact face F with respect to the external object is located slightly above the mask pattern 5. However, since the mask pattern 5 is arranged to be partly embedded in the mask substrate 1, it is extremely difficult to be separated as compared with that in the conventional photo-mask in FIG. 15.

By the first embodiment of the present invention as described so far, undesirable separation of the mask pattern does not readily take place, and thus, a highly reliable photo-mask with a long life may be provided at low cost.

Referring to FIGS. 3(a) to 3(f), there is sequentially shown in the order of manufacturing steps, a method of manufacturing a photo-mask according to a second embodiment of the present invention as follows.

Step (i) Onto a light-transmitting mask substrate 1 made of quartz, glass or the like, a thin film 6 (e.g., $Si_3N_4$ is suitable) transparent to light such as ultraviolet rays and the like, and having such a nature that it allows isotropic etching proceed in a dry etching process, is caused to adhere by vapor deposition, sputtering, etc. (FIG. 3(a)).

Figure 3A:
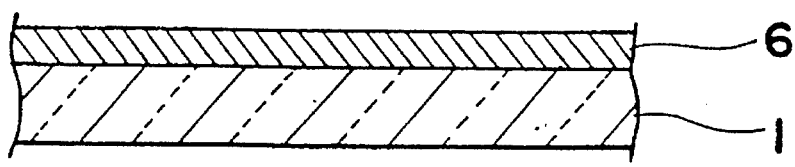
FIGS. 3(a) to 3(f) are schematic sectional diagrams showing manufacturing steps of a photo-mask according to a second embodiment of the present invention.
Figure 3B:
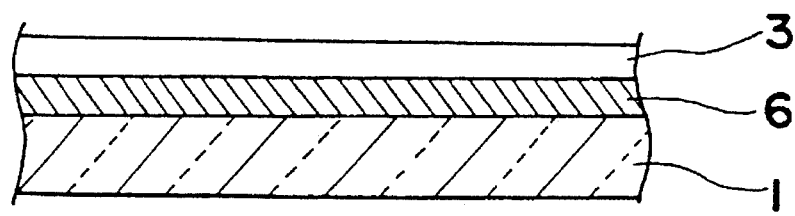

Step (ii) After application of the above thin film 6, a resist film 3 is further applied thereon (FIG. 3(b)).

Figure 3C:
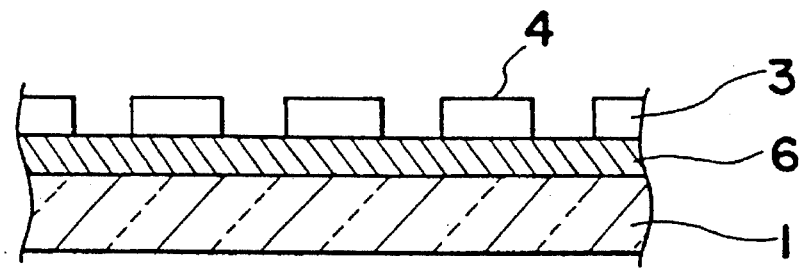
Figure 3D:
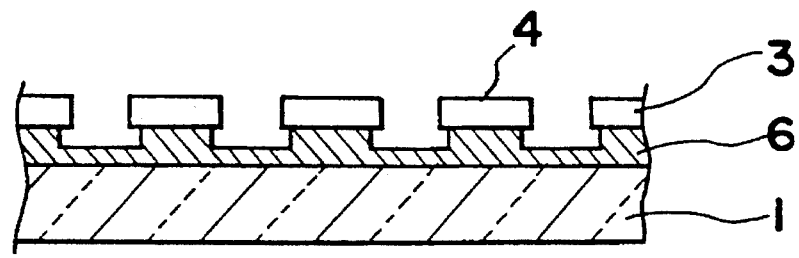

Step (iii) The resist film 3 is subjected to light exposure through employment of an electron beam or laser light so as to form a resist pattern 4 through a developing process (FIG. 3(c)).

Step (iv) In the state as covered by the resist pattern 4, the thin film 6 is subjected to dry etching to form grooves in said thin film 6. Here, since isotropic etching proceeds in the thin film 6, a side etching is formed (FIG. 3(d)).

Figure 3E:
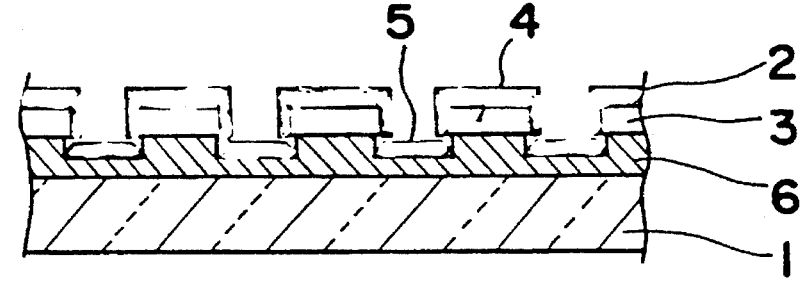

Step (v) After completion of the above etching, and in the state as covered by the resist pattern 4, a thin film 2 of Cr, Ta or the like which is not transparent to light such as ultraviolet rays, etc. therethrough is caused to adhere thereonto by vapor deposition, sputtering or the like (FIG. 3(e)).

Figure 3F:
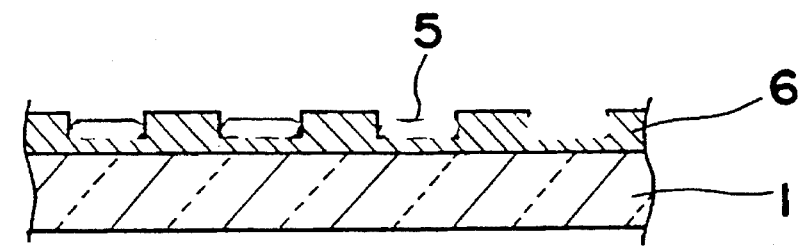

Step (vi) Finally, the thin film 2 adhering onto the resist pattern 4 is separated together with the resist pattern 4, thereby to form the photo-mask having a mask pattern 5 (FIG. 3(f)).

Figure 4A:
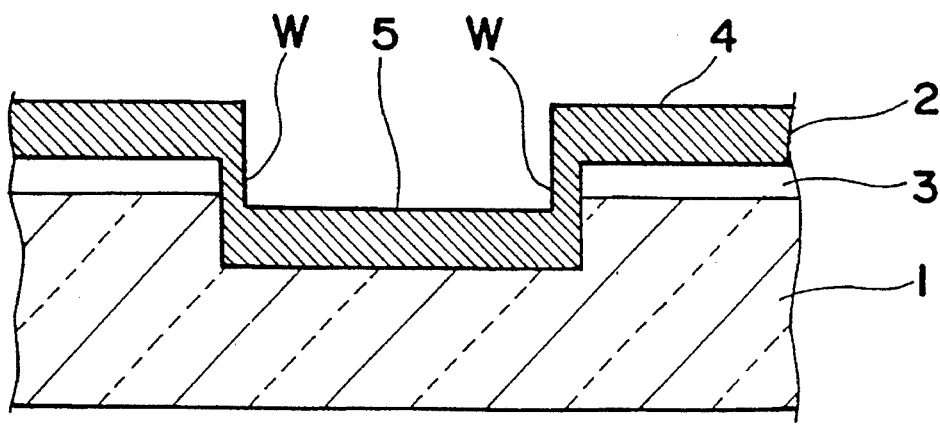
FIGS. 4(a) and 4(b) are fragmentary side sectional views showing the configuration of a groove in the course of manufacturing the photo-mask.
Figure 4B:
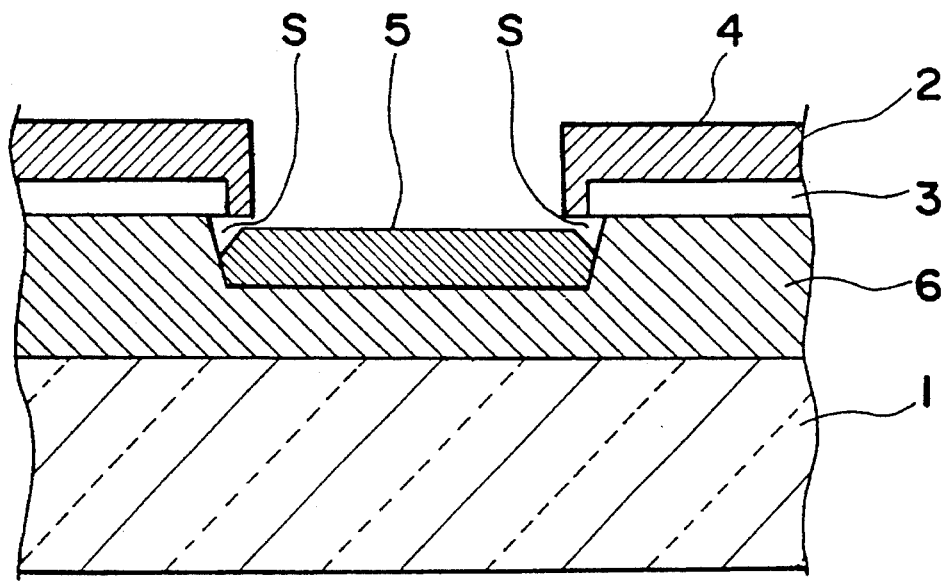

For comparison, FIG. 4(a) shows a fragmentary cross section of a photo-mask in which grooves are formed without providing the thin film 6 on the mask substrate 1, while FIG. 4(b) shows a similar view in which grooves are formed by providing the thin film 6 on the substrate 1.

In the photo-mask of FIG. 4(a), owing to the absence of the thin film 6, anisotropic etching proceeds in the mask substrate 1 of quartz, glass or the like. Therefore, the thin film 2 undesirably covers pattern side wall portions W, and it becomes difficult to separate the thin film 2 adhering to the upper portion of the resist film 3.

On the other hand, in the photo-mask of FIG. 4(b), since the thin film 6 is present, isotropic etching proceeds in said thin film 6, thereby to form side etching portions S. Due to the fact that discontinuous portions are formed in the side etching portions S when the thin film 2 is affixed, said thin film 2 adhering to the portions of the resist pattern 4 may be readily separated together with the resist film 3.

Figure 5:
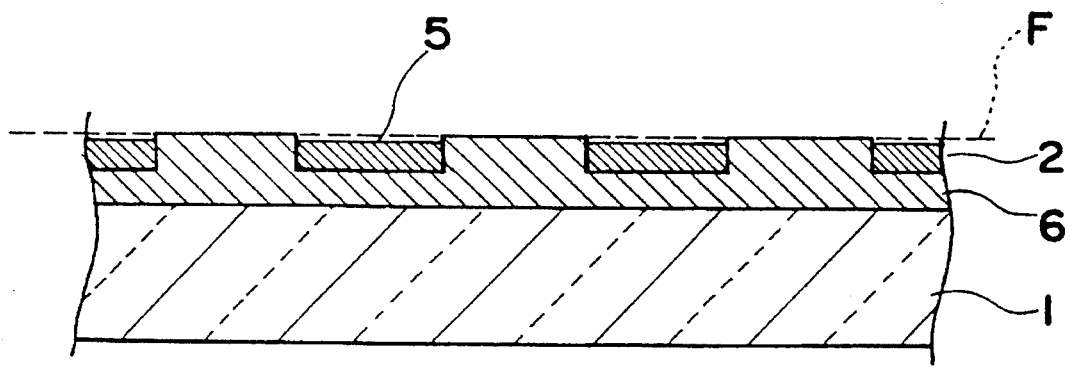
FIG. 5 is a fragmentary side sectional view of the photo-mask produced by the method of FIGS. 3(a) to 3(f)

FIG. 5 shows a fragmentary cross section of the photo-mask prepared by the method of the present invention. In this case, the contact face F with respect to the external object (not shown) is located on the surface of the mask substrate 1, and the external force due to washing, etc., is absorbed into the surface of said substrate, and thus, the mask pattern 5 becomes very difficult to be separated.

By the second embodiment of the present invention as described so far, separation of the mask pattern does not readily take place, and accordingly, a highly reliable photo-mask with a long life may be advantageously provided.

FIGS. 6(a) to 6(f) show a method of manufacturing a photo-mask according to a third embodiment of the present invention in the order of manufacturing steps as given below.

Figure 6A:
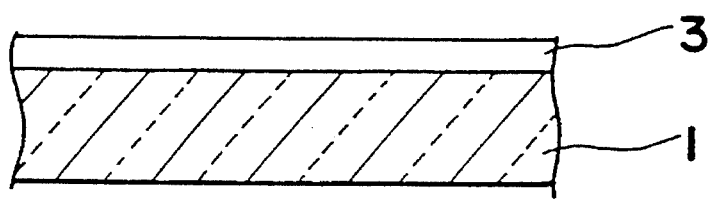
FIGS. 6(a) to 6(f) are schematic sectional diagrams showing manufacturing steps of a photo-mask according to a third embodiment of the present invention.

Step (i) A resist film 3 is applied onto a mask substrate 1 made of quartz, glass or the like (FIG. 6(a)).

Figure 6B:
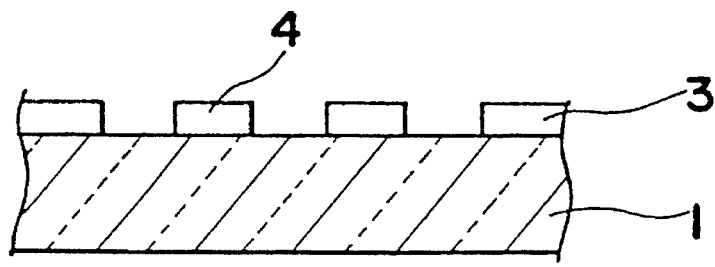

Step (ii) The resist film 3 is subjected to light exposure through employment of an electron beam or laser light so as to form a resist pattern 4 through a developing process (FIG. 6(b)).

Figure 6C:
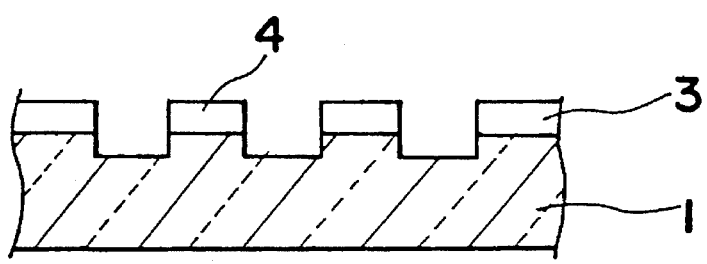

Step (iii) In the state as covered by the resist pattern 4, the mask substrate 1 is subjected to anisotropic etching by dry etching at portions not covered by the resist film (FIG. 6(c)).

Figure 6D:
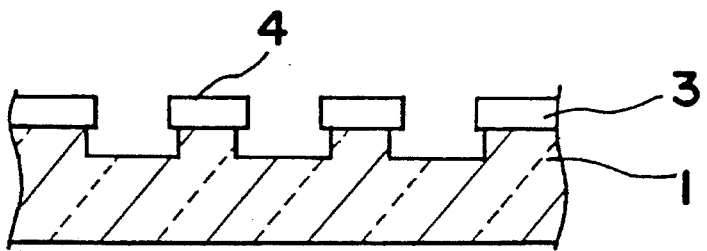

Step (iv) After completion of the above dry etching, wet etching is effected, and thus, the isotropic etching of the mask substrate 1 is effected (FIG. 6(d)).

Figure 6E:
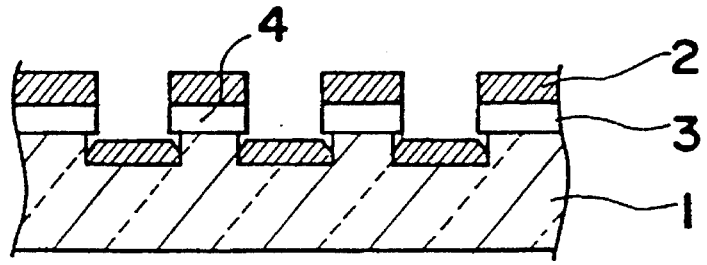

Step (v) After completion of the above dry etching and wet etching, and in the state as covered by the resist pattern 4, a thin film 2 of Cr, Ta or the like which does not transmit light such as ultraviolet rays, etc. therethrough is caused to adhere thereonto by vapor deposition, sputtering or the like (FIG. 6(e)).

Figure 6F:
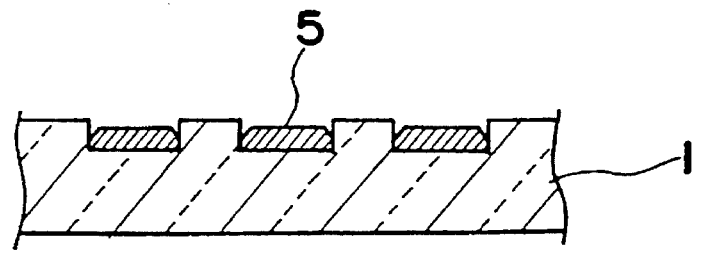

Step (vi) Finally, the light-shielding thin film 2 adhering onto the resist pattern 4 is separated together with the resist pattern 4, thereby to form the photo-mask having a mask pattern 5 (FIG. 6(f)).

Figure 7A:
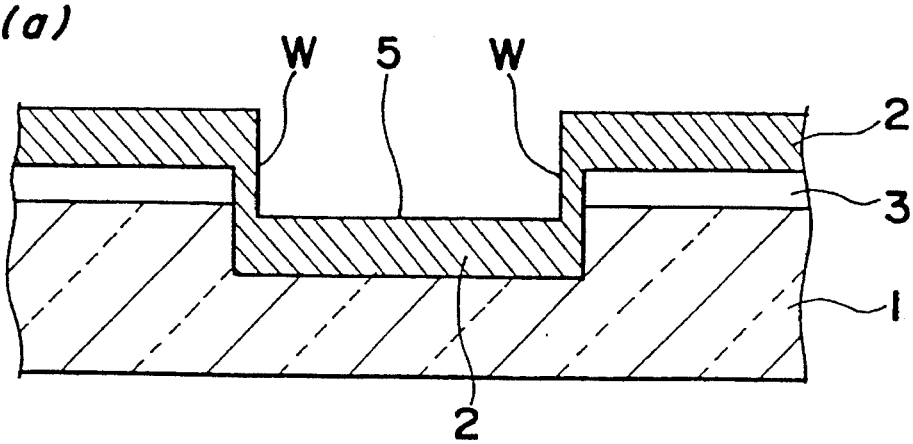
FIGS. 7(a), 7(b) and 7(c) are fragmentary side sectional views showing the configuration of a groove in the course of manufacturing the photo-mask.
Figure 7B:
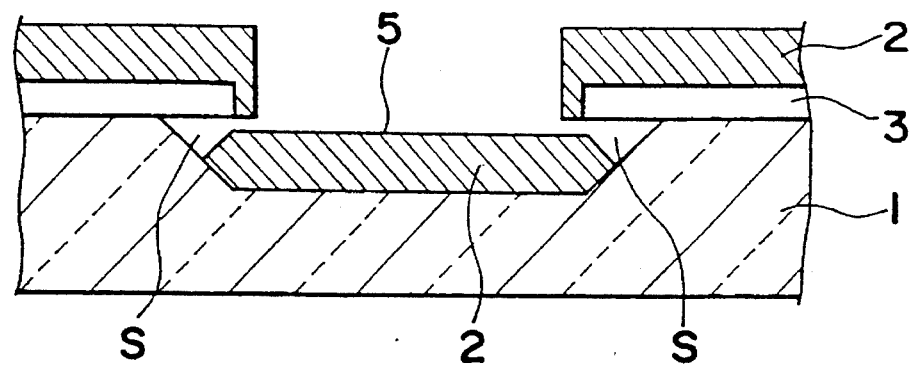
Figure 7C:
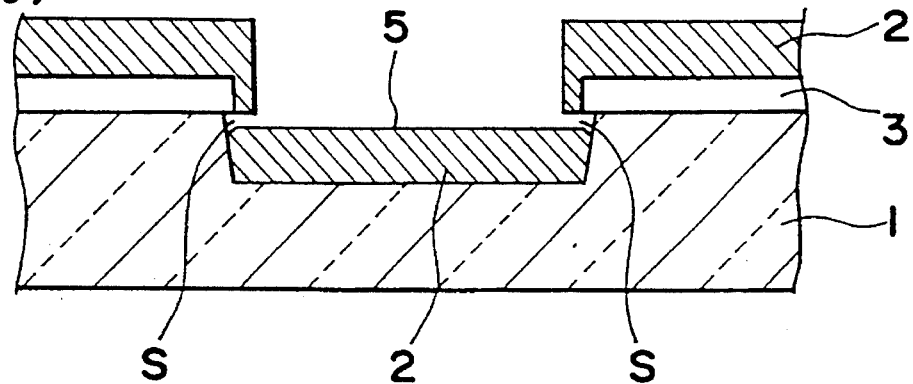

FIGS. 7(a), 7(b) and 7(c) respectively show fragmentary cross sections of photo-masks prepared by applying the light-shielding thin films 2 of Cr, Ta or the like, after forming grooves on the photo-mask substrates by various etching methods.

The photo-mask of FIG. 7(a) shows the state where the groove is formed only by the dry etching. Since the dry etching is anisotropic etching, the mask pattern 5 may be formed with high accuracy. However, due to the fact that the groove side walls become generally perpendicular, the light-shielding thin film 2 undesirably covers the pattern side wall portions W, thus making it difficult to separate the light-shielding thin film 2 adhering to the resist portion 3. Meanwhile, the photo-mask of FIG. 7(b) represents the state where the groove is made only by the wet etching. Since the wet etching causes isotropic etching, side etching portions S are formed. In this case, the thin film 2 becomes discontinuous at the side etching portions S, and therefore, the thin film 2 adhering to the resist portion may be readily separated. However, there is a problem in that the dimensional accuracy of the mask pattern 5 tends to be deteriorated by the side etching.

The photo-mask of FIG. 7(c) is directly related to the present invention, and shows the state where the groove is formed by first effecting dry etching, with subsequent wet etching. By first dry etching, the dimensional accuracy of the mask pattern 5 is ensured, and by effecting the subsequent wet etching to form the side etching portions S to a certain extent, separation of the light-shielding thin film 2 adhering to the resist portion can be facilitated.

Figure 8:
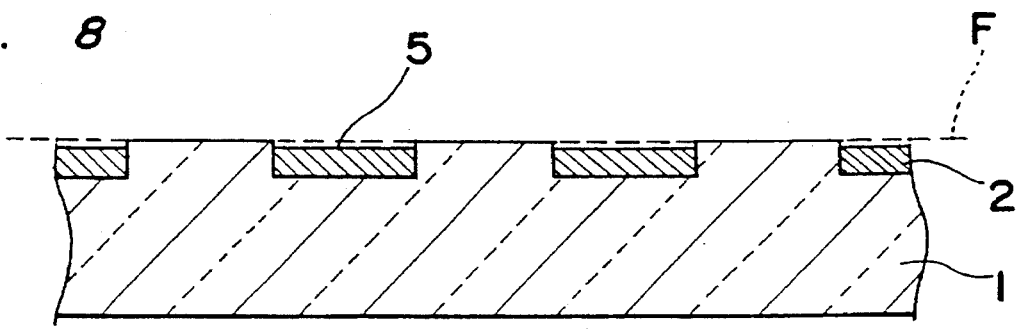
FIG. 8 is a fragmentary side sectional view of the photo-mask produced by the method of FIGS. 6(a) to 6(f)

FIG. 8 shows a fragmentary side sectional view of the photo-mask prepared by the method of the present invention. In this photo-mask, the contact face F with respect to the external object is also present on the surface of the mask substrate 1, and thus, external force due to washing, etc. is absorbed into the surface of the mask substrate. Therefore, the mask pattern 5 becomes very difficult to be separated in the similar manner as in the previous embodiments.

Shown in FIGS. 9(a) through 9(f) is a method of manufacturing a photo-mask according to a fourth embodiment of the present invention as sequentially illustrated in the order of manufacturing steps as follows.

Step (i) Onto a light-transmitting mask substrate 1 made of quartz, glass or the like, a thin film 6B (e.g., Si, Mo, $Si_3N_4$, etc.) having a nature such that isotropic etching proceeds therein in a dry etching process, is caused to adhere by vapor deposition, sputtering, etc. (FIG. 9(a)).

Figure 9A:
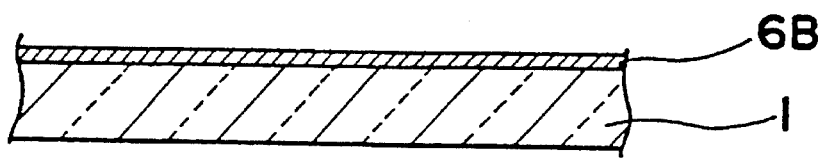
FIGS. 9(a) to 9(f) are schematic sectional diagrams showing manufacturing steps of a photo-mask according to a fourth embodiment of the present invention.
Figure 9B:
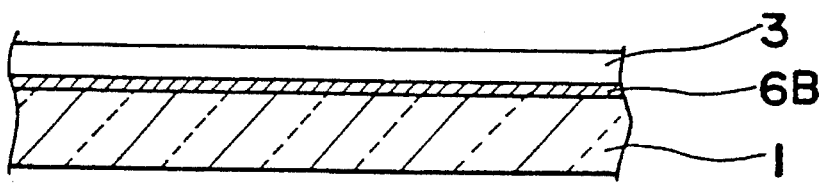

Step (ii) After application of the above thin film 6B, a resist film 3 is further applied thereon (FIG. 9(b)).

Figure 9C:
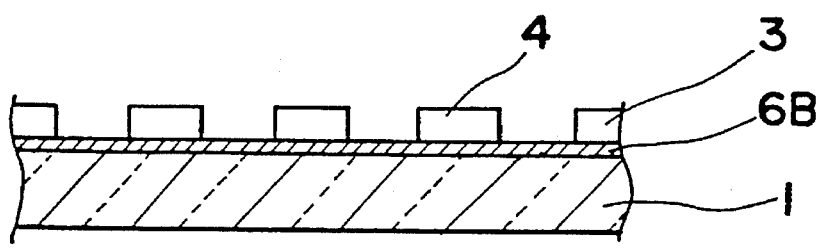

Step (iii) The resist film 3 is subjected to light exposure through employment of an electron beam or laser light so as to form a resist pattern 4 through a developing process (FIG. 9(c)).

Figure 9D:
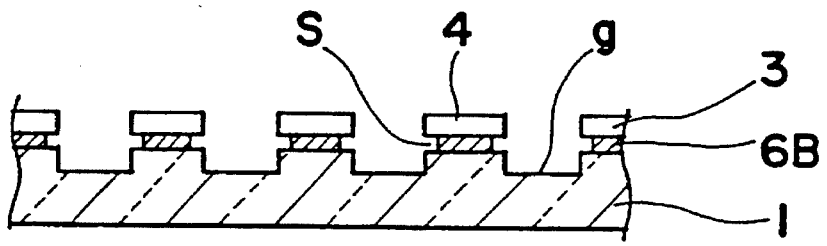

Step (iv) In the state as covered by the resist pattern 4, the thin film 6B is subjected to dry etching to form grooves g in said resist pattern (FIG. 9(d)). Here, since isotropic etching proceeds in the thin film 6B, side etching portions S are formed, while anisotropic etching proceeds in the mask substrate 1 of quartz, glass, etc., and thus, no side etching takes place.

Figure 9E:
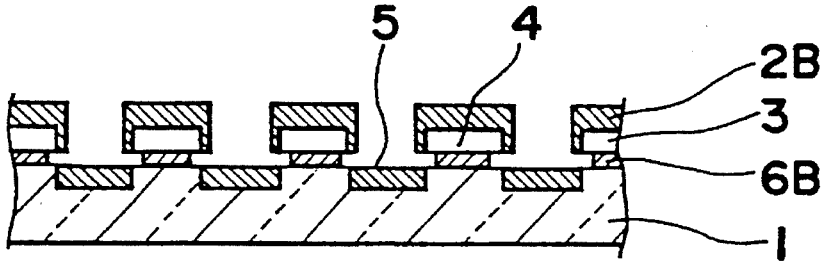

Step (v) Subsequently, in the state as covered by the resist pattern 4, a thin film 2B of Cr, Ta or the like which does not transmit light such as ultraviolet rays, etc. therethrough is caused to adhere thereonto by vapor deposition, sputtering or the like (FIG. 9(e)).

Figure 9F:
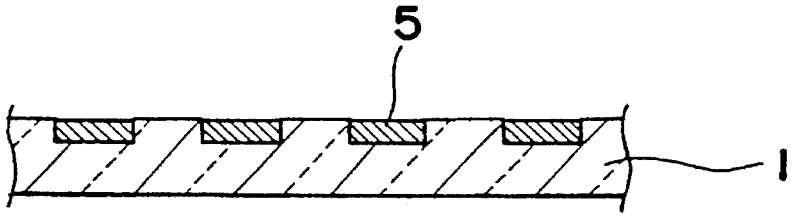

Step (vi) Finally, the thin film 2B adhering onto the resist pattern 4 is separated together with the resist pattern 4, and thereafter, the thin film 6B is removed or said thin film 6B is separated together with the resist film 3, thereby to form the photo-mask having a mask pattern 5 (FIG. 9(f)).

Figure 10A:
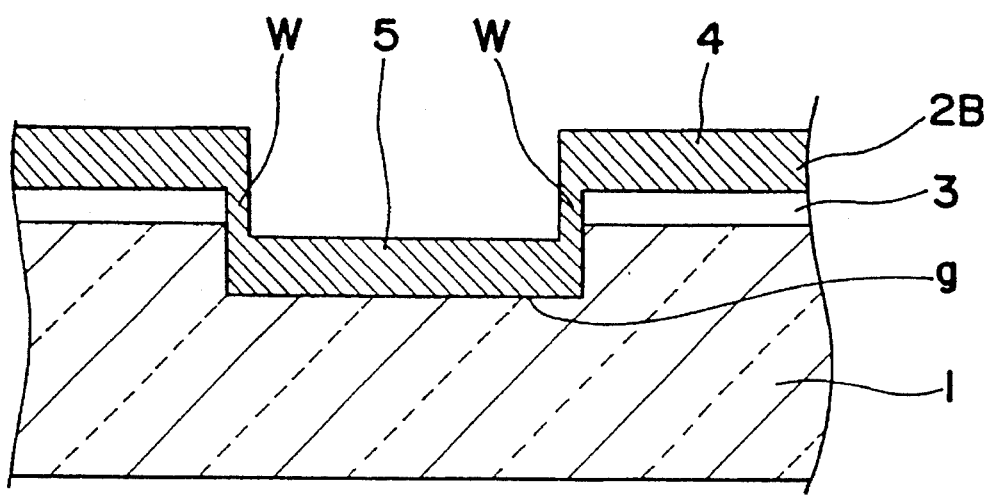
FIGS. 10(a) and 10(b) are fragmentary side sectional views each showing the configuration of a groove in the course of manufacturing the photo-mask.
Figure 10B:
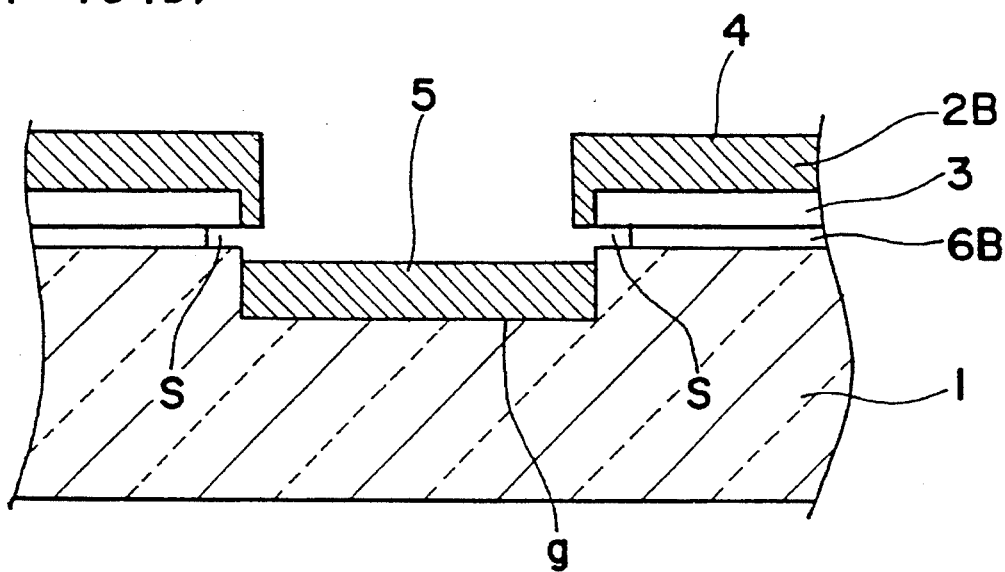

FIGS. 10(a) and 10(b) respectively show fragmentary cross sections of photo-masks, with the thin films 2B of Cr, Ta, etc. applied thereto, in the case where the grooves g are formed without providing the thin film 6B, and also, in the case where the grooves g are formed by providing the thin film 6B.

In FIG. 10(a) representing the case without the thin film 6B, since the anisotropic etching proceeds in the mask substrate of quartz, glass and the like at step (iv), the thin film 2B undesirably covers the side wall portions W, and it becomes difficult to separate the thin film 2B adhering to the resist portion.

In FIG. 10(b) showing the case where the thin film 6B is provided, although the anisotropic etching proceeds in the mask substrate of quartz, glass or the like at step (iv), the isotropic etching proceeds in the thin film 6B, and thus, the side etching portions S are formed. Therefore, upon application of the thin film 2B, discontinuous portions are formed at the side etching portions S, and thus, the thin film 2B at the resist pattern 4 may be readily separated by the separation of the resist film 3 or removal of the thin film 6B. Meanwhile, since the anisotropic etching proceeds in the mask substrate 1, the mask pattern 5 can be formed with high dimensional accuracy.

Figure 11:
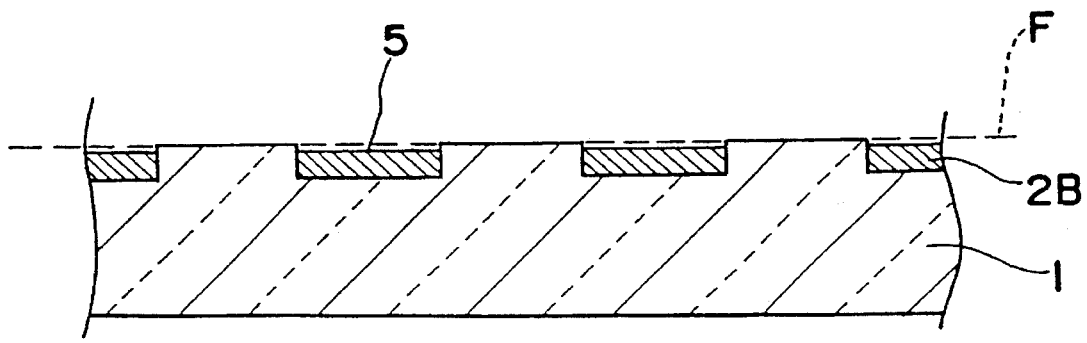
FIG. 11 is a fragmentary side sectional view of the photo-mask produced by the method of FIGS. 9(a) to 9(f)

FIG. 11 shows a fragmentary cross section of a photo-mask prepared by the method of the present invention as described above. In this case also, since the contact face F with respect to the external object is located at the upper surface of the mask substrate 1, external force due to washing and the like is absorbed into the surface of said substrate, and the mask pattern 5 becomes very difficult to be separated. By the above embodiment of the present invention, a highly reliable photo-mask with a long life and having the mask pattern not readily separated can be presented.

Referring further to FIGS. 12(a) to 12(g), there is shown, in the order of manufacturing steps, a method of manufacturing a photo-mask according to a fifth embodiment of the present invention as follows.

Figure 12A:
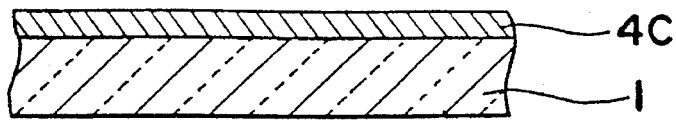
FIGS. 12(a) to 12(g) are schematic sectional diagrams showing manufacturing steps of a photo-mask according to a fifth embodiment of the present invention.

In the first place, as shown in FIG. 12(a), a positive type photo-resist is applied onto a flat plate-like light-transmitting substrate 1 made of quartz, glass or the like by a spin-coat process, etc., so as to form a light-sensitive film 4C thereon.

Figure 12B:
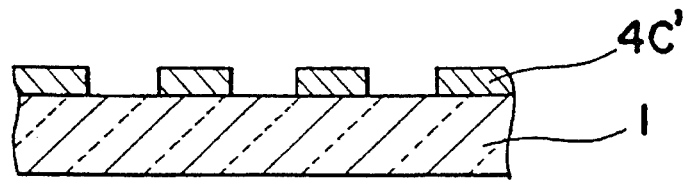

Subsequently, the resist film 4C is subjected to light exposure through employment of an electron beam, laser light or the like to form a desired fine pattern through a developing process, thereby to obtain a resist film 4C' at the remaining necessary portion (FIG. 12(b)).

Figure 12C:
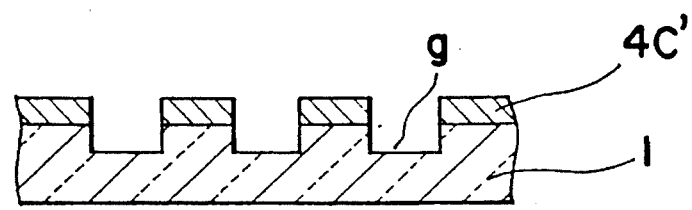

Then, by effecting anisotropic etching based on dry etching or the like, grooves g are formed in the light-transmitting mask substrate 1 at portions not covered by the resist film 4C' (FIG. 12(c)).

Figure 12D:
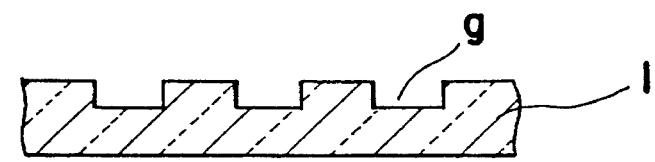

Thereafter, as shown in FIG. 12(d), the resist film 4C' is removed by washing, etc.

Further, a light-shielding material layer 2C is formed by causing Cr, Ta or the like to adhere onto the light-transmitting mask substrate 1 through vapor deposition, sputtering, etc. In this embodiment, the thickness t of the light-shielding layer 2C is arranged to be larger than the depth d of the groove g. The surface of the light-shielding material layer 2C has the undulation or concave and convex portions corresponding to the undulation of the substrate 1.

Subsequently, through application thereonto, a material having an etching rate of the same degree as that of the light-shielding layer 2C, for example, positive type photo-resist, by the spin-coat process, etc., a height supplementing layer H of a uniform height is formed on the light shielding material layer 2C (FIG. 12(f)).

Figure 12E:
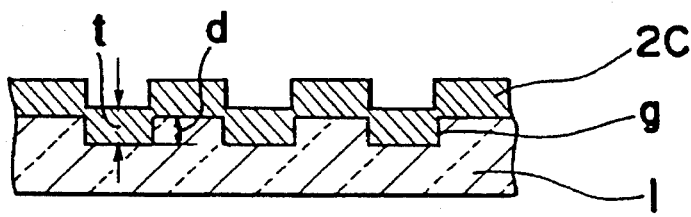
Figure 12F:
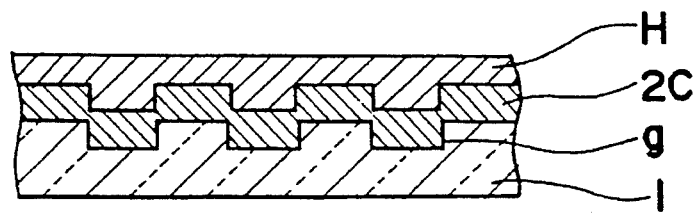
Figure 12G:
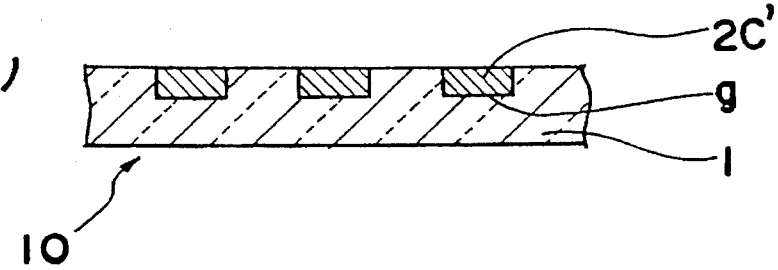

Finally, when the etching of the height supplementing layer H and light-shielding material layer 2C are effected by the dry etching, etc., both of these layers H and 2C are removed by maintaining the uniform height, since they are equal in the etching rate, and if this processing is continued for a proper time, the surface of the mask substrate 1 is exposed, with the light-shielding layer 2C' remaining in the grooves g as shown in FIG. 12(g), and thus, the photo-mask 10 according to the present invention may be obtained.

As will be understood by FIG. 12(g), in the above photo-mask 10, since the light-shielding material layer 2C' is located in the groove g without protruding from the surface of the light-transmitting mask substrate 1, such layer 2C' is free from separation even if an external force is applied thereto by washing, etc.

Figure 13A:
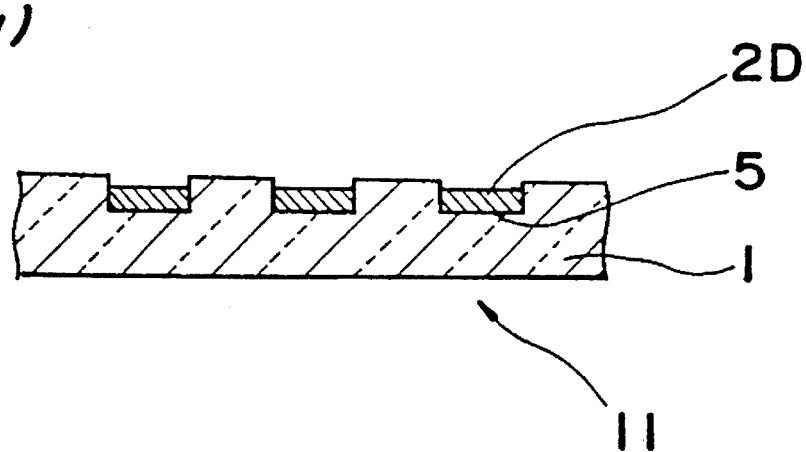
FIGS. 13(a) and 13(b) are fragmentary side sectional views showing constructions of other photo-masks to be prepared by the manufacturing method of the present invention.
Figure 13B:
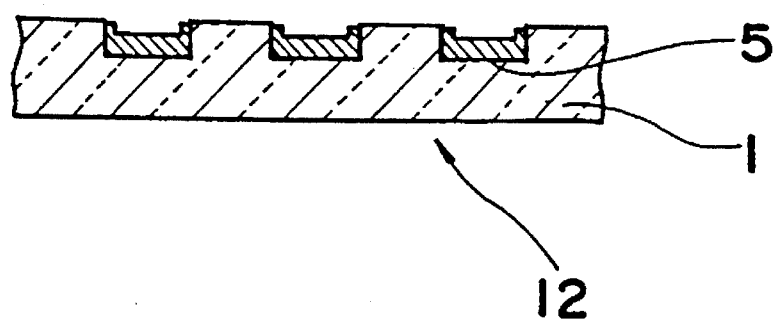

FIGS. 13(a) and 13(b) show modified photo-masks to be obtained by the manufacturing method of the present invention.

In the photo-mask 11 shown in FIG. 13(a), the surface of the light-shielding material layer 2D is formed, in height, to be lower than the surface of the light-transmitting mask substrate 1. Such photo-mask 11 may be prepared by making the etching rate of the height supplementing layer H to be larger than that of the light-shielding material layer 2C in the step of FIG. 12(f).

Meanwhile, the photo-mask 12 as shown in FIG. 13(b) may be produced by making the thickness t of the light-shielding material layer 2C to be smaller than the depth d of the groove g for the light-transmitting mask substrate 1 at the step of FIG. 12(e).

For a further modification of the photo-mask according to the present invention, there may be raised a photo-mask produced in such a manner as to be processed into the state of FIG. 12(g) by polishing, without passing through the step of FIG. 12(f), after the step of FIG. 12(e).

As is clear from the foregoing description, according to the above embodiment of the present invention, the method of manufacturing a photo-mask is characterized in that it includes the steps of forming a resist layer on a light-transmitting mask substrate, forming a desired pattern on said resist layer by light exposure and development, forming grooves of a desired pattern on the light-transmitting mask substrate by anisotropic etching, removing the resist layer on said light-transmitting mask substrate, forming a light-shielding material layer on said light-transmitting mask substrate formed with said grooves, further forming a height-supplementing layer on said light-shielding material layer so as to make the surface to be generally of a uniform height, and removing said height-supplementing layer and said light-shielding material layer by a predetermined thickness so as to cause the surface of said mask substrate other than the portions of said grooves to be exposed.

By the above method of the present invention, a highly reliable photo-mask with a long life and free from separation of the mask pattern can be advantageously provided. Furthermore, according to the manufacturing method of the present invention, the edge shape of the mask pattern may be accurately formed, without inviting any problems such as faulty electrical conduction, etc., and moreover, since all etching may be effected by dry etching, there is no problem related to waste solutions, etc. in the actual applications.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as being included therein.

What is claimed is:

1. A method of manufacturing a photo-mask for an optical disc which comprises the steps of:

applying a resist film onto a substrate;

subjecting said resist film to light exposure and development to form a fine resist pattern;

etching said substrate at portions not covered by said fine resist pattern so as to form an etched substrate groove;

adhering a non-light transmitting thin film on said fine resist pattern and said etched substrate groove, said thin film being thicker than a thickness of said fine resist pattern; and removing said thin film formed on said fine resist pattern together with said resist film only to a depth equal to the thickness of said resist film to form said photo-mask having a mask pattern of said thin film embedded within said etched substrate groove and such that the surface of said mask pattern is higher than the surface of said substrate.

2. The method as defined in claim 1, wherein said substrate comprises quartz or glass, and resist film is subjected to light exposure of an electron beam or laser light, said substrate is etched by a wet or dry etching method, said non-light transmitting thin film comprises Ta, and said thin film is adhered by vapor deposition or sputtering.

3. The method as defined in claim 1, wherein said thin film comprises Ta.

* * * * *